United States Patent [19]

Henein et al.

[11] Patent Number: 4,645,116
[45] Date of Patent: Feb. 24, 1987

[54] FLUXLESS BONDING OF MICROELECTRONIC CHIPS

[75] Inventors: Gerard E. Henein, Berkeley Heights; Ralph T. Hepplewhite, Millington; Bertram Schwartz, Westfield, all of N.J.

[73] Assignee: AT&T Bell Laboratories, Murray Hill, N.J.

[21] Appl. No.: 648,411

[22] Filed: Sep. 5, 1984

Related U.S. Application Data

[63] Continuation-in-part of Ser. No. 433,382, Oct. 8, 1982, abandoned.

[51] Int. Cl.$^4$ .................... B23K 1/02; B23K 1/20; B23K 35/00
[52] U.S. Cl. .................... 228/123; 228/220; 228/200; 228/263.12; 219/85 CM; 219/85 A
[58] Field of Search ............... 228/123, 124, 220, 221, 228/200, 263.12; 219/9.5, 10.53, 85 A, 85 CA, 85 CM

[56] References Cited

U.S. PATENT DOCUMENTS

| | | | |
|---|---|---|---|
| 2,813,191 | 11/1957 | Gray, III | 219/85 CA |
| 3,045,093 | 7/1962 | Morgan et al. | 219/9.5 |
| 3,857,161 | 12/1974 | Hutchins, IV | 228/220 X |
| 4,142,662 | 3/1979 | Holbrook et al. | 228/123 X |
| 4,321,617 | 3/1982 | Duda et al. | 228/123 X |
| 4,389,557 | 6/1983 | Devenyi et al. | 219/85 CM |

FOREIGN PATENT DOCUMENTS 1149604 4/1969 United Kingdom .

OTHER PUBLICATIONS

Brusic et al., published abstract from *IBM Technical Disclosure Bulletin*, vol. 21, No. 4, Sep. 1978, p. 1688.

Primary Examiner—Kenneth J. Ramsey
Attorney, Agent, or Firm—Michael J. Urbano

[57] ABSTRACT

Indium is used to bond semiconductor lasers to their heat-sinks without the presence of a corrosive liquid flux. Fluxless bonding is achieved in a vacuum chamber in reducing ambients of CO or $H_2$. Low strain bonds are achieved at bonding temperatures of approximately 180°–240° C. in CO and 220°–230° C. in $H_2$. Void-free bonds are achieved in CO at temperatures as low as about 205° C. The technique is applicable to other microelectronic chips such as LEDs, for example.

34 Claims, 3 Drawing Figures

FLUXLESS BONDING OF MICROELECTRONIC CHIPS

This is a continuation-in-part of application Ser. No. 433,382, filed Oct. 8, 1982.

BACKGROUND OF THE INVENTION

This invention relates to the bonding of microelectronic chips to an electrically conducting bonding surface and, more particularly, to the bonding of semiconductor laser chips to their heat sinks.

A semiconductor laser is a tiny device typically measuring only about 250 $\mu$m in width across the mirror facets and about 400 $\mu$m in length along the optical resonator. The active region of the laser, where recombination of holes and electrons generates stimulated emission, is even smaller. In a typical stripe geometry, double heterostructure (DH) laser the active region may be only 3-5 $\mu$m wide, 0.1-0.2 $\mu$m thick and 400 $\mu$m long. As a consequence, when a typical pumping current of, say, 100 mA, is applied to the laser, the current density in the active region may be of the order of 5000 A/cm$^2$. Since the lasers are commonly operated continuous wave at or near room temperature, appreciable heating occurs. Excessive heating, of course, would damage the laser.

In order to prevent such damage, the removal of heat from the laser chip is facilitated by bonding the chip to a suitable heat sink, which is commonly made of a high thermal conductivity material (e.g., copper or diamond). However, the bonding operation must be performed carefully so as to avoid inducing in the laser chip excessive strain which, it has been found, is deleterious to laser reliability and lifetime. That is, the common laser substrate materials, GaAs and InP, are brittle and may crack under undue stress (e.g., 10$^9$ dyn/cm$^2$). Moreover, stress may generate defects in the active region or cause defects to migrate to the active region.

Thus, thermo-compression and ultrasonic chip bonding, widely used techniques in the other semiconductor fields, have been largely rejected in the semiconductor laser art in favor of soldering in the presence of a corrosive flux. In this method, a thick gold bonding pad is deposited on the ohmic contact on one side of the laser chip, and a thin gold layer is formed on a Cu stud (heat sink). A thick layer of a soft, ductile, low melting point metal (commonly indium) is evaporated onto the gold layer on the stud and is then placed in contact with the gold bonding pad. A small weight (e.g., 5 gm) is lowered onto the chip, and the stud temperature is raised to about 280° C. in an atmosphere of forming gas in order to melt the indium and to bond the chip to the stud. However, the indium layer tends to oxidize before the bond is completed, and oxides in the bond are increase heat generation because of their high electrical resistivity and poor thermal conductivity. Also, because the melting point of the oxide is higher than that of the solder, the presence of a solid surface oxide prevents the solder from wetting at the bonding temperature. In order to insure ease and reproducibility in realizing these bonds, and to keep electrical conductance high, a liquid flux (e.g., ZnCl$_2$—NH$_4$Cl—H$_2$) is used to dissolve the indium oxide and allow the liquid indium to flow and wet the gold on the laser chip.

This flux soldering procedure has several drawbacks, however. First, the danger exists of chlorine-containing residues becoming trapped within the bond. ZnCl$_2$, for instance, transforms into ZnO, Zn(OH)Cl and HCl in the presence of small amounts of water and thus is a potential corrosive agent in devices operated in humid ambients. Second, the flux boils at the required bonding temperature of 260°–280° C. and becomes a carrier for liquid indium droplets which, if they hit the sides of the chip, can produce a short-circuit or cause interference with the light beam exiting the laser facet. Third, voids 20–100 $\mu$m in size are created during bonding by bubbles of boiling flux entrapped inside the indium. These voids can drastically affect heat removal in the bond area because they represent barriers of practically infinite thermal resistance. If located directly under the active region, voids can raise the junction temperature considerably: theoretical calculations show that a 30 $\mu$m void raises the junction temperature by 7.8° C. and a 100 $\mu$m void by 47.5° C. Fourth, the bonds are frequently incompletely wetted; i.e., the actual bond area is smaller than the gold bonding pad. This shortcoming may be due to improper application of the flux which is applied manually and hence is very operator dependent. Fifth, the bonds frequently contain large amounts of Au—In intermetallic compounds (e.g., Au$_4$In, Au$_9$In, AuIn, and AuIn$_2$) which can result in hard bonds. The absence of a pure indium layer after bonding or the presence of the harder intermetallic compounds allows thermal stresses (due to the difference in thermal expansion coefficients between the heat sink and the laser) as well as intrinsic stresses (induced by the presence of the intermetallics) to be transmitted to the active region of the laser.

Forming low-stress, void-free bonds is also of interest with other microelectronic chips, for example, LEDs which are bonded to a metallic header.

SUMMARY OF THE INVENTION

We have found that reproducible, low-strain, void-free, completely wetted, bonds between semiconductor laser chips and their heat sinks can be realized by a fluxless technique. The inventive procedure, carried out in a vacuum chamber, entails the use of a soft, ductile metal, in the presence of CO or essentially pure H$_2$, to solder a metalized heat sink to a metal layer on the chip. Preferably, the soft, ductile metal is indium and the heat-sink is heated to a temperature in the range of about 180°–240° C. when CO is used and in the range of about 220°–230° C. when H$_2$ is used. LEDs and other microelectric chips can be bonded to a bonding surface, for example a header, in similar fashion.

BRIEF DESCRIPTION OF THE DRAWING

Our invention, together with its various features and advantages, can be readily understood from the following, more detailed description taken in conjunction with the accompanying drawing, in which.

DETAILED DESCRIPTION

1. Thermodynamics

Figure 1:
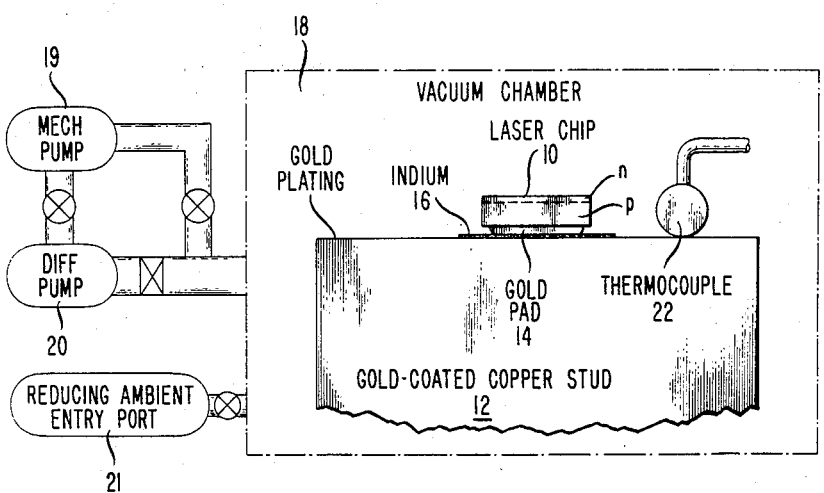
FIG. 1 is a schematic drawing showing a semiconductor laser chip and a heat sink positioned in a vacuum chamber for bonding in accordance with one embodiment of our invention.

Before discussing the step-by-step procedures employed in practicing our invention, it will be instructive to consider first the thermodynamics of the reduction of the oxide which forms on the soft, ductile metal used to effect the bond: indium sesquioxide in the case where indium is the metal, and tin dioxide in the case where tin (usually a Sn—Au alloy) is the metal. Based on the thermodynamics of indium sesquioxide (the stable form at room temperature), hydrogen and carbon monoxide were chosen as the reducing gases. The reaction with hydrogen at the bonding temperature is:

$$In_2O_3 + 3H_2(g) \rightleftharpoons 2In(l) + 3H_2O(g) \qquad (1)$$

The free energy $\Delta F_T$ of the reduction reaction is expressed as:

$$\Delta F_T = \Delta F_T^0 + RTLnK \qquad (2)$$

where $$K = (P_{H_2O}/P_{H_2})^3 \qquad (3)$$

Equation (3) shows that the equilibrium constant K is the cube of the ratio of the partial pressures of water vapor and hydrogen, $\Delta F_T^0$ is the free energy at 25° C. and R is the ideal gas constant. In order for the reduction reaction to proceed at temperature T, a necessary condition is:

$$\Delta F_T < 0;$$

that is, $$P_{H_2O}/P_{H_2} < \exp(-\Delta F_T^0/3RT) \qquad (4)$$

For analytic purposes, a normal bonding temperature of 200° C. was chosen as a compromise between two opposing tendencies: the reduction reaction becomes faster with increasing temperature, but the bonded devices become more strained. It has been established that the threshold for the occurrence of high strains in flux-bonded devices is 200° C., as evidenced by the photoelastic effect. Literature values of $\Delta F_T^0$ at 200° C. average to 26.5 ($\pm 3\%$) kcal/mole. The value of $P_{H_2O}/P_{H_2}$ calculated from Eq. (4) is $9 \times 10^{-5}$ ($\pm 25\%$). A value of this partial pressure ratio $\lesssim 9 \times 10^{-5}$ is therefore suitable.

The reaction with carbon monoxide is similar to the one with hydrogen, $$In_2O_3(s) + 3CO(g) \rightleftharpoons 2In(l) + 3CO_2(g) \qquad (5)$$

A free energy of 11 kcal/mole was calculated from the free-energies of formation of $In_2O_3$, CO and $CO_2$ at 200° C. The calculated value of $P_{CO_2}/P_{CO}$ is $2 \times 10^{-2}$. As before, a value of this partial pressure ratio $\lesssim 2 \times 10^{-2}$ is therefore suitable.

The partial pressure ratios indicate that the reduction of $In_2O_3$ is possible provided a high enough vacuum is created in the bonding chamber and that pure enough gases are used. More specifically, if a base vacuum of $10^{-5}$ Torr is used, then $P_{CO_2}/P_{CO} = 2 \times 10^{-2}$ translates into a minimum $P_{CO}$ of about 0.5 μm and $P_{H_2O}/P_{H_2}$ translates into a minimum $P_{H_2}$ of about 100 μm. However, the thermodynamics favor reduction with CO more than with $H_2$. Similar considerations apply to the reduction of $SnO_2$ where $P_{CO_2}/P_{CO} = 1.08$ and $P_{H_2O}/P_{H_2} = 1 \times 10^{-2}$ at 232° C. (the melting point of Sn).

2. Experimental Procedure

In accordance with one embodiment of our invention, and as shown in FIG. 1, an AlGaAs DH semiconductor laser chip 10 was bonded to Au-plated Cu heat sink (or stud) 12. A gold bonding pad 14 was electroplated on the p-side electrical contact (Ti-Pt) of the laser chip, and a layer 16 of In solder was evaporated onto the top of the stud 12. However, it is possible (although not preferable) to form the In layer 16 on the bonding pad 14 instead of on stud 12. This procedure would entail forming the In layer prior to chip separation and would require care to keep In off of the laser mirrors.

The bonding was done in a vacuum chamber 18 consisting of a bell-jar (not shown) evacuated by a mechanical pump 19 and diffusion pump 20. The stud was held between two spring-loaded, graphite electrodes (not shown). An electrical current applied to these electrodes provided resistive heating of the stud 12 and In layer 16. The surface temperature of the stud was measured with a Pt-PtRh thermocouple 22 in physical contact with the stud surface. To eliminate systematic errors, the thermocouple was calibrated in place in both CO and $H_2$ using the melting points of In on a Au-plated stud and of Sn and Pb on bare Cu studs.

Figure 2:
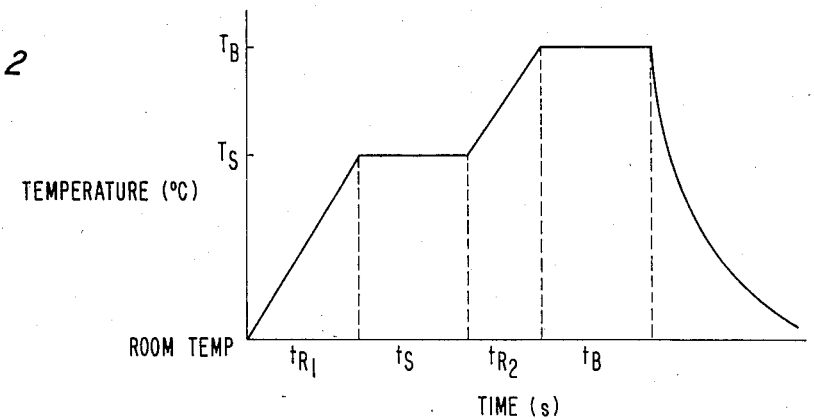
FIG. 2 is a graph showing the temperature-time profile during an illustrative bonding operation.

After the gold pad 14 of the laser chip 10 had been positioned on the indium layer 16 on stud 12, the pressure of the vacuum chamber was reduced to about $10^{-2}$ Torr using the mechanical pump 19 and was then backfilled three times with the reducing gas through entry port 21. The chamber pressure was then reduced to about $10^{-5}$ Torr using the diffusion pump 20 and backfilled again. After a final pumpdown to about $1.0 \times 10^{-5}$ Torr using the diffusion pump 20, the reducing gas was admitted to the chamber through port 21 up to a pressure of 150-200 μm Hg. The bond was then made by applying power to the graphite electrodes. The time-temperature cycle (FIG. 2) was composed of five parts: a first ramp (duration $t_{R1}$) from room temperature to the melting point $T_s$ of indium (157° C.); a first plateau (duration $t_s$) at the melting point; a second ramp (duration $t_{R2}$) to the bonding temperature $T_B$; a second plateau (duration $t_B$) at the bonding temperature; and a fast cool-down to room temperature. In some cases the cycle had only three parts; that is, $t_s = 0$ and the temperature was raised from room temperature to the bonding temperature directly. All of the devices used in the initial studies were AlGaAs DH lasers, although this fluxless bonding technique has been used equally well with InGaAsP/InP lasers.

If a manipulator is available inside the chamber, it is possible to keep the chip and In layer separate from one another until time $t_{R1} + t_s + t_{R2}$ when contact is effected between the chip and the melted solder.

3. Results With Carbon Monoxide

Our initial set of experiments utilized a 5 μm thick In layer, a 12 μm thick gold pad, and a 3-part time temperature cycle with $t_s = 0$, $t_{R1} + t_{R2} = 20-25$ sec. and $t_B = 5-25$ sec. The bonding temperature $t_B$ ranged from 158° C. to 276° C. The strains generated in the laser chip during bonding were imaged in an infra-red (IR) microscope using the photoelastic effect. The results indicated that it is possible to bond chips without liquid flux in a CO ambient in the range of temperatures 180°-275° C. with bonding times as low as 5 seconds. Below 180° C. the bonds were nonreproducible. However, bonds with low strain (less than about $10^8$ dyn/cm$^2$) were achieved in the range of about 180°–240° C. In comparison, stress of the order of $10^9$ dyn/cm$^2$ has been shown to induce ductile fracture in the epitaxial layers of a laser chip.

In another set of experiments we studied the influence of the bonding temperature and the time and of the presence or absence of a weight resting on the chip on the following parameters: wetting, void content, bond nature (soft vs. hard) and induced stress (measured using single crystal X-ray diffractometry in the Automatic Bragg Angle Control (ABAC) mode, rather than using an IR microscope and the photoelastic effect. The bonding temperature $t_B$ varied between 167° and 230° C. and the bonding time $T_B$ between 25 and 150 sec. Different temperature profiles were examined: ramp ($t_s = 0$; $t_{R1} = 25$–60 sec.); ramp and soak at the bonding temperature ($t_{R1} = 20$–35 sec., $t_s = 30$ sec., $t_{R2} = 25$ sec.); ramp and soak at temperature $T_S$; and slow cooling.

The devices had a 2000 Å thick gold bonding pads 14, and studs 12 were covered with a 1 $\mu$m thick electroplated gold layer followed by a 9 $\mu$m thick layer 16 of evaporated indium. Bonding was achieved, as before, by bringing the stud to temperature under a flow of CO at a presure of 1 Torr (1000 $\mu$m Hg) after several pumpdown-backfill cycles including a final pumpdown to about $2 \times 10^{-5}$ Torr. A ratio of the partial pressures $P_{CO2}/P_{CO} \lesssim 2 \times 10^{-5}$ ensured the reduction of indium oxide In$_2$O$_3$ at temperatures around 200° C.

The use of a 5 gram weight resting on the laser during bonding was found to be detrimental. In most instances, molten indium was squeezed out from under the chip resulting in a partly or wholly intermetallic bond. Such bonds induced nonuniform stresses in the device. In contrast, an ABAC scan taken of a chip bonded under the same conditions of temperature and time, but without weight, exhibited a low and very uniform level of stress along the device (stress $< 0.2 \times 10^8$ dyn/cm$^2$).

Practically no influence on the bonding temperature-time profile was observed within the range studied. The only exception was a 60 sec. slow cool from 230° to 100° C. which induced nonuniform and high stresses in the device. In contrast, a single bonding ramp ($t_{R1} + t_{R2}$) as short as 25 sec. yielded a satisfactory bond.

A marked influence of the temperature was observed upon the wetting characteristics. Chips bonded at 204° C. and below showed, upon debonding, that incomplete wetting of the gold pad had occurred (island-like wetting), irrespective of the bonding time. Chips bonded at 208° C. and above exhibited complete wetting of the gold pad by the indium.

Figure 3:
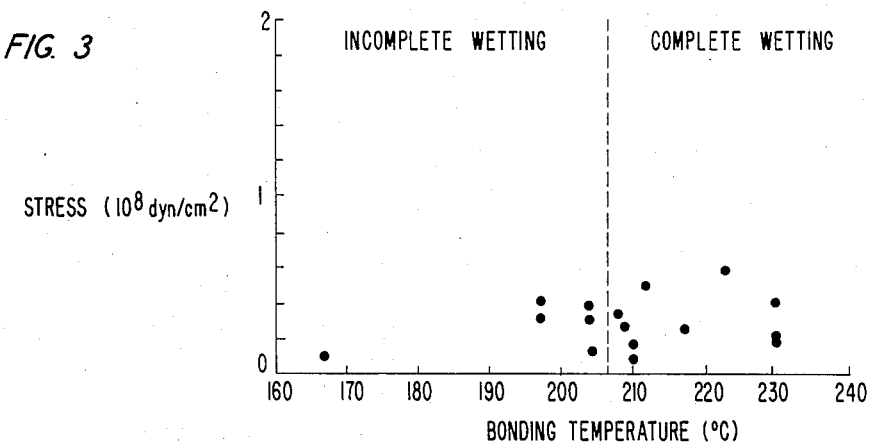
FIG. 3 shows a representative distribution of stress in chips bonded at various temperatures in accordance with our invention.

Bonding temperatures between 208° and 223° C. reproducibly kept the stress in the chips to values lower than $0.6 \times 10^8$ dyn/cm$^2$; i.e., such temperatures did not significantly affect the stress level, as compared with that present in the chips prior to bonding. Bonding-induced stresses started to reach significant values at about 230° C. where values as high as $\sim 1.2 \times 10^8$ dyn/cm$^2$ were reached. The values of the stresses in weightless- and fluxless-bonded chips are plotted versus bonding temperature in FIG. 3.

Our fluxless bonding technique results in entirely void-free bonds in every instance when complete wetting is achieved (i.e., above 204° C.).

In addition, the technique is very clean in that no creeping of indium on the saw-cut faces of the chips nor any spattering of indium on the mirror facets was ever observed. This result is again in contrast with the flux bonding technique in which the liquid flux acts as a carrier for indium droplets.

In summary, our fluxless bonding technique is capable of reproducibly yielding good quality, void-free and adequately wetted bonds with a bonding temperature 75° C. below that ordinarily used for flux bonding (205° vs. 280° C.). The stresss induced in the device by this technique can reproducibly be kept below $0.6 \times 10^8$ dyn/cm$^2$.

4. Results with Hydrogen

These experiments were performed using chips and procedures (i.e., IR microscopy) of the type employed in the initial experiment with CO. The bonding strains induced in the device were high above $\sim 250°$ C. and moderate to low below this temperature. Low-stress bonds occurred in the range of about 220°–230° C.

Three differences can be noted as compared with the results obtained in CO. First, the lowest temperature leading to a bond was higher (220° C. in H$_2$, 180° C. in CO), which is consistent with the difference between the free-energies of the reduction of In$_2$O$_3$ by CO and H$_2$. Second, all the shear tests left the bonds unaffected by a force of 150 grams indicating that the conversion of indium to Au-In intermetallics was more complete in the presence of H$_2$. That is, the interdiffusion between Au and In was faster. This conclusion is in agreement with the observation that diffusion rates in solids are strongly dependent on the annealing ambient. Third, the range of temperatures over which low-strain bonds achieved was narrower: 220°–230° C. in H$_2$ but 180°–240° C. in CO.

As with CO, the meniscus formed by liquid indium between the gold pad and the stud was much smaller for H$_2$-bonded lasers than for lasers bonded using a liquid flux.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, we expect similar results with Sn-alloy solders, In-alloy solders, and with InP/InGaAsP laser chips. Moreover, other microelectronic chips can be bonded to a metalized support member (e.g., header or heat sink) using our technique. Finally, besides resistance heating other techniques, such as RF heating or radiation (laser) heating, can be employed to effect the fluxless bond.

5. Multi-Chip Bonder Using RF Heating

In a manufacturing environment a plurality of devices are simultaneously bonded to their respective heat sinks (studs). To ensure that the bonds are substantially uniform among the devices, the heating step should subject each of the devices to substantially the same temperature (e.g., to within a tolerance of a few degrees). RF induction heating is well suited for this purpose. Also, since our CO fluxless technique is based on having a low partial pressure ratio $P_{CO2}/P_{CO}$, it is necessary to perform the bonding operation in an evacuable chamber (e.g., a vessel connected to a vacuum system). Alternative system configurations include (1) an elongated furnace tube surrounded by a traveling induction coil, in which case the devices are mounted inside the tube on one or more strip-like susceptors oriented along the tube axis, and (2) a bell-jar surrounded by a stationary coil, in which case the devices are mounted in the bell-jar on a ring-like susceptor (holder). In the following laser example, the bell-jar system was chosen because it is easier to load the heat sinks (laser "studs") and to position the devices on their respective studs. Once accurately placed in position, each device simply rests on an indium solder patch on its stud.

The circular geometry of the induction coil dictated a a circular symmetry for the susceptor. It was therefore designed as a ring, containing 12 holes for the studs, and was positionable in close proximity to the coil.

The heating power supply was a 2.5 kW RF generator which delivered a 250–450 kHz AC current. The bell-jar, which was made of pyrex, was secured by a teflon ring inside the coil and moved up and down with the latter along the tracks of a manually operated hoist. The coil/bell-jar assembly was maintained in any position by a negator-type spring.

Illustratively, the susceptor included 12 individual cup-like stainless steel receptacles on the periphery of a stainless steel ring. A toroidal conduit having 24 pinholes was positioned under the ring to allow gas to exit upward toward the susceptor. A laser stud was mounted in the center of each cup. This design had two features: (1) its surface-to-volume ratio was relatively large, which speeds up both heating and cooling, and (2) the chips sitting on top of the studs are recessed inside the cups, thereby protecting them from the sudden pressure burst which occurs when the CO is first let into the bell-jar.

The stud temperature in the bell-jar was measured by an iron-constantan subminiature thermocouple in direct contact with the upper surface of a "dummy" stud on the susceptor. The position of the thermocouple and the circular symmetry of the bonding assembly ensured that the temperature read in this way was representative of the actual temperature of the indium solder on all the studs.

The pumping system included a direct drive rotary mechanical pump and an oil-diffusion pump equipped with a liquid nitrogen trap. All the valves were electropneumatic and could be operated via a switch control panel or via a relay panel for automatic sequencing. The chamber could be pumped from atmosphere to $5 \times 10^{-6}$ Torr in about 3 minutes.

After the lasers were placed on the solder patches of the studs, the bell-jar was lowered, sealed over the susceptor, and pumped down to $5 \times 10^{-6}$ Torr in about 3 minutes. Then the bell-jar was backfilled by a continuous flow of 99.99% pure CO at a pressure of 40 Torr. Power was applied to the induction coil so that the temperature increased from 25° C. to about 225° C. in about 60 seconds. This temperature was maintained for about 20 seconds to effect bonding. The RF power and CO flow were then shut off, and a flow of $N_2$ at a pressure of 200 Torr was admitted into the bell-jar to cool the susceptor. After cooling to about 55° C., which was achieved in about 4 minutes, the $N_2$ flow was shut off, and the bell-jar was brought to atmospheric pressure. The bonded chips were then unloaded from the susceptor.

What is claimed is:

1. A method of manufacturing a device, which includes bonding a metal layer on a microelectronic chip to a metalized support member, comprising the steps of:
   (a) providing a bonding layer of soft, ductile bonding material on at least one of the metal layer and the support member, the bonding layer having a tendency to form an oxide thereon, said oxide being reducible with the consequent generation of a gaseous reduction product,
   (b) placing the assembly of the bonding layer, chip and support member in an evacuable chamber,
   (c) reducing the pressure in the chamber to a subatmospheric pressure in order to decrease the partial pressure of said gaseous reduction product,
   (d) introducing a reducing gas into the chamber,
   (e) at a time between steps (a) and (f), bringing the bonding layer into contact with the other of the metal layer and the support member in the absence of any liquid flux, and
   (f) heating the bonding layer to a temperature which is above its melting point, said temperature of step (f) and said pressure of step (c) being effective for said reducing gas to reduce said oxide thereon.

2. The method of claim 1 wherein said bonding material comprises a tin alloy.

3. The method of claim 2 wherein said gas comprises essentially pure $H_2$.

4. The method of claim 3 wherein in step (d) the partial pressure of water vapor $P_{H2O}$ and the partial pressure of hydrogen $P_{H2}$ are related as $P_{H2O}/P_{H2} \lesssim 1 \times 10^{-2}$.

5. The method of claim 2 wherein said gas comprises CO.

6. The method of claim 5 wherein in step (d) the partial pressure of carbon dioxide $P_{CO2}$ and the partial pressure of carbon monoxide $P_{CO}$ are related as $P_{CO2}/P_{CO} \lesssim 1.08$.

7. The method of claim 1 wherein said bonding material comprises indium.

8. The method of claim 7 wherein said gas comprises essentially pure $H_2$.

9. The method of claim 8 wherein in step (d) the partial pressure of water vapor $P_{H2O}$ and the partial pressure of hydrogen $P_{H2}$ are related as $P_{H2O}/P_{H2} \lesssim 9 \times 10^{-5}$.

10. The method of claim 9 wherein in step (c) the pressure of the chamber is reduced to at least about $10^{-5}$ Torr and $P_{H2}$ is at least about 100 μm Hg.

11. The method of claim 10 for making a low strain bond wherein in step (f) the indium bonding layer is heated to a temperature of about 220°–230° C.

12. The method of claim 11 wherein the metal layer on the chip and metalization on the support member both comprise gold.

13. The method of claim 12 wherein the chip comprises a semiconductor laser and the support member comprises a copper heat sink.

14. The method of claim 7 wherein said gas comprises CO.

15. The method of claim 14 wherein in step (d) the partial pressure of carbon dioxide $P_{CO2}$ and the partial pressure of carbon monoxide $P_{CO}$ are related as $P_{CO2}/P_{CO} \lesssim 2 \times 10^{-2}$.

16. The method of claim 15 wherein in step (c) the pressure in the chamber is reduced to at least about $10^{-5}$ Torr and $P_{CO}$ is at least about 0.5 μm Hg.

17. The method of claim 16 for making a low strain bond wherein in step (f) the indium bonding layer is heated to a temperature of about 180°–240° C.

18. The method of claim 17 for making a bond which also exhibits essentially complete wetting wherein the bonding layer is heated to a temperature of about 205°–230° C.

19. The method of claim 18 wherein the metal layer on the chip and the metalization on the support member both comprise gold.

20. The method of claim 19 wherein the chip comprises a semiconductor laser and the support member comprises a copper heat sink.

21. A method of manufacturing a device, which includes bonding a semiconductor laser chip to a heat sink, comprising the steps of:
   (a) forming a gold bonding pad on the chip,
   (b) forming a gold coating on the heat sink,
   (c) forming an indium bonding layer on the gold coating, the indium layer having a tendency to form an oxide thereon, said oxide being reducible with the consequent generation of a gaseous reduction product,
   (d) placing the chip and heat sink in an evacuable chamber,
   (e) reducing the pressure in the chamber to a subatmospheric pressure in order to reduce the partial pressure of said gaseous reduction product,
   (f) introducing into the chamber a reducing gas selected from the group consisting of CO and essentially pure $H_2$,
   (g) at a time between steps (c) and (h), bringing the indium bonding layer into contact with the cold bonding pad in the absence of any liquid flux, and
   (h) heating the bonding layer to a temperature which is above the melting point of indium, said temperature of step (h) and said pressure of step (e) being effective for said reducing gas to reduce said oxide thereon.

22. The method of claim 21 wherein the chamber pressure is reduced to at least about $10^{-5}$ Torr and the gas comprises essentially pure $H_2$ at a pressure in excess of 100 $\mu$m Hg.

23. The method of claim 22 wherein the bonding layer is heated to about 220°-230° C. so as to effect a low strain bond.

24. The method of claim 21 wherein the chamber presure is reduced to at least about $10^{-5}$ Torr and the gas comprises CO at a pressure in excess of 0.5 $\mu$m Hg.

25. The method of claim 24 wherein the bonding layer is heated to about 180°-240° C. to effect a low strain bond.

26. The method of claim 25 wherein the bonding layer is heated to about 205°-230° C. to effect a bond which also exhibits essentially complete wetting of the indium on the gold bonding pad.

27. The method of claims 22, 24, or 26 wherein the bonding layer is heated by applying electrical current to the heat sink.

28. The method of claims 21, 24, or 26 wherein the chip is a double heterostructure comprising layers of material selected from the GaAs-AlGaAs and the InP-InGaAsP materials systems.

29. A method of manufacturing a device, which includes bonding a gold bonding pad on a semiconductor laser chip to a gold-plated copper stud via an indium layer evaporated on the stud, comprisng the steps of:
   (a) placing the chip and heat sink in an evacuable chamber,
   (b) reducing the chamber pressure to at least about $10^{-5}$ Torr in order to reduce the partial pressure of $CO_2$,
   (c) introducing into the chamber a reducing gas comprising CO at a pressure of at least 0.5 $\mu$m Hg,
   (d) at a time prior to step (e), bringing the indium layer into contact with the gold bonding pad in the absence of any liquid flux, and
   (e) heating the bonding layer to a temperature in the range of about 205°-230° C. so as to effect a bond between the chip and stud which exhibits a stress less than about $10^8$ dyn/cm$^2$ and which is essentially void-free.

30. The method of claim 21, 22, 24 or 26 wherein the bonding layer is heated by an RF induction coil.

31. The method of claim 30 for bonding a plurality of laser chips to a plurality of heat sinks wherein,
   in step (d), the chamber includes therein a circular susceptor having a plurality of mounts around the periphery thereof for receiving the heat sinks, the coil surrounding the susceptor in the proximity of the heat sinks,
   in step (d), the chips are positioned on the heat sinks, and
   in step (h) the bonding layers are heated by applying RF power to the coil to raise the temperature of the layers to the bonding temperature.

32. The method of claim 31 further including, after step (h), the additional step (i) of cooling the bonded-chip and heat-sink-assemblies by introducing into the chamber a flow of $N_2$ gas.

33. The method of claim 30 for bonding a plurality of laser chips to a plurality of heat sinks wherein,
   in step (d), the chamber includes an elongated tube and a susceptor therein having a plurality of mounts for positioning the heat sinks along the tube, the coil being movably mounted around the tube, and
   in step (h), the bonding layers are heated by applying RF power to the coil to raise the temperature of the layers to the bonding temperature and by moving the coil along the tube.

34. The method of claim 29 further including, after step (e), the additional step (f) of cooling the bonded-chip and heat-sink-assemblies by introducing into the chamber a flow of $N_2$ gas.

* * * * *